US011805616B2

(12) United States Patent
Kim et al.

(10) Patent No.: US 11,805,616 B2
(45) Date of Patent: Oct. 31, 2023

(54) POLYIMIDE-BASED COMPOSITE FILM AND DISPLAY DEVICE COMPRISING SAME

(71) Applicants: SK microworks Co., Ltd., Gyeonggi-do (KR); SK microworks solutions Co., Ltd., Chungcheongnam-do (KR)

(72) Inventors: Sunhwan Kim, Incheon (KR); Jung Hee Ki, Gyeonggi-do (KR); Jin Woo Lee, Seoul (KR); Dawoo Jeong, Gyeonggi-do (KR); Seung Yong Pyun, Chungcheongnam-do (KR); Yun Hee Seo, Gyeonggi-do (KR)

(73) Assignees: SK microworks Co., Ltd., Gyeonggi-do (KR); SK microworks solutions Co., Ltd., Chungcheongnam-do (KR)

( * ) Notice: Subject to any disclaimer, the term of this patent is extended or adjusted under 35 U.S.C. 154(b) by 401 days.

(21) Appl. No.: 16/941,709

(22) Filed: Jul. 29, 2020

(65) Prior Publication Data
US 2021/0051811 A1 Feb. 18, 2021

(30) Foreign Application Priority Data
Aug. 14, 2019 (KR) .................. 10-2019-0099628

(51) Int. Cl.
| H05K 5/03 | (2006.01) |
| H05K 5/00 | (2006.01) |
| C08K 3/36 | (2006.01) |
| C08K 3/30 | (2006.01) |
| C08K 3/26 | (2006.01) |
| C08J 5/18 | (2006.01) |
| B29C 39/14 | (2006.01) |
| B29K 79/00 | (2006.01) |
| B29L 31/34 | (2006.01) |
| H10K 50/84 | (2023.01) |

(52) U.S. Cl.
CPC .................. H05K 5/03 (2013.01); C08J 5/18 (2013.01); C08K 3/26 (2013.01); C08K 3/30 (2013.01); C08K 3/36 (2013.01); H05K 5/0017 (2013.01); B29C 39/14 (2013.01); B29K 2079/08 (2013.01); B29L 2031/3475 (2013.01); C08J 2379/08 (2013.01); C08K 2003/265 (2013.01); C08K 2003/3045 (2013.01); C08K 2201/003 (2013.01); H10K 50/84 (2023.02)

(58) Field of Classification Search
None
See application file for complete search history.

(56) References Cited

U.S. PATENT DOCUMENTS

| 2011/0250444 A1 | 10/2011 | Pietrantoni et al. |
| 2017/0190880 A1 | 7/2017 | Jo et al. |

FOREIGN PATENT DOCUMENTS

| CN | 106928706 A | 7/2017 |
| JP | H5-32953 A | 2/1993 |
| JP | H10-244765 A | 9/1998 |
| JP | 2011-221528 A | 11/2011 |
| JP | 2012-017419 A | 1/2012 |
| JP | 2015-230901 A | 12/2015 |
| JP | 2016-54734 A | 4/2016 |
| JP | 2017-163898 A | 9/2017 |
| JP | 6538259 B1 | 7/2019 |
| JP | 6556317 B1 | 8/2019 |
| KR | 10-2018-0104772 A | 9/2018 |
| WO | 2016/104420 A1 | 6/2016 |
| WO | 2017/200042 A1 | 11/2017 |

OTHER PUBLICATIONS

Machine translation of Nakajima et al. JPH10244765 (Year: 1997).*
Machine translation of Fujinaga et al. (JP 6556317) (Year: 2019).*
Office Action issued by Korean Patent Office dated Nov. 19, 2020.
Office Action for Chinese Patent Application No. 202010806713.2 issued by the Chinese Patent Office dated Jun. 20, 2022.
Office Action issued by the Japanese Patent Office dated Aug. 3, 2021.
Office Action for Japanese Patent Application No. 2022-009593 issued by the Japanese Patent Office dated Dec. 6, 2022.

* cited by examiner

Primary Examiner — Robert T Butcher
(74) Attorney, Agent, or Firm — IP & T GROUP LLP

(57) ABSTRACT

Embodiments relate to a polyimide-based composite film, which comprises a base film comprising a polyimide-based resin; and a functional layer disposed on the base film, wherein when the side of the functional layer located opposite to the side in contact with the base film is referred to as a first side and when the side of the base film in contact with the functional layer is referred to as a second side, the leveling index represented by Equation 1 is less than 0.75.

12 Claims, 3 Drawing Sheets

POLYIMIDE-BASED COMPOSITE FILM AND DISPLAY DEVICE COMPRISING SAME

The present application claims priority of Korean patent application numbers 10-2019-0099628 filed on Aug. 14, 2019. The disclosure of each of the foregoing applications is incorporated herein by reference in its entirety.

TECHNICAL FIELD

Embodiments relate to a polyimide-based composite film that is colorless, transparent, and excellent in mechanical properties and optical properties, and a display device comprising the same.

BACKGROUND ART OF THE INVENTION

Polyimide-based resins such as polyamide-imide (PAI) are excellent in resistance to friction, heat, and chemicals. Thus, they are employed in such applications as primary electrical insulation, coatings, adhesives, resins for extrusion, heat-resistant paintings, heat-resistant boards, heat-resistant adhesives, heat-resistant fibers, and heat-resistant films.

Such a polyimide-based resin is used in various fields. For example, polyimide-based resins are made in the form of a powder and used as a coating for a metal or a magnetic wire. They are mixed with other additives depending on the applications thereof. In addition, polyimide-based resins are used together with a fluoropolymer as a painter for decoration and corrosion prevention. They also play a role of bonding a fluoropolymer to a metal substrate. In addition, a polyimide-based resin is used to coat kitchenware, used as a membrane for gas separation by virtue of its heat resistance and chemical resistance, and used in natural gas wells for filtration of such contaminants as carbon dioxide, hydrogen sulfide, and impurities.

In recent years, a polyimide-based resin has been developed in the form of a film, which is less expensive and has excellent optical, mechanical, and thermal characteristics.

DISCLOSURE OF THE INVENTION

Problem to be Solved

Embodiments aim to provide a polyimide-based composite film that is colorless, transparent, and excellent in mechanical properties and optical properties, and a display device comprising the same.

Solution to the Problem

The polyimide-based composite film according to an embodiment comprises a base film comprising a polyimide-based resin; and a functional layer disposed on the base film, wherein when the side of the functional layer located opposite to the side in contact with the base film is referred to as a first side and when the side of the base film in contact with the functional layer is referred to as a second side, the leveling index represented by the following Equation 1 is less than 0.75.

$$\text{Leveling index} = \frac{Sz2 - Sz1}{Sz2 + Sz1} \quad \text{[Equation 1]}$$

Here, Sz1 is the Sz roughness (μm) of the first side, and Sz2 is the Sz roughness (μm) of the second side.

The display device according to another embodiment comprises a display panel; and a cover window disposed on the display panel, wherein the cover window comprises a base film and a functional layer disposed on the base film, and when the side of the functional layer located opposite to the side in contact with the base film is referred to as a first side and when the side of the base film in contact with the functional layer is referred to as a second side, the leveling index represented by the above Equation 1 is less than 0.75.

Advantageous Effects of the Invention

The polyimide-based composite film according to an embodiment has an appropriate range of Sz roughness (Sz1) of the first side and Sz roughness (Sz2) of the second side and satisfies the value of Equation 1 of less than 0.75. Thus, the functional layer may have enhanced mechanical strength, whereby the polyimide-based composite film according to the embodiment may have enhanced mechanical properties and optical properties.

In addition, the display device according to another embodiment may have enhanced mechanical properties and optical properties.

DETAILED DESCRIPTION FOR CARRYING OUT THE INVENTION

Hereinafter, the present invention will be described in detail with reference to embodiments. The embodiments are not limited to those described below. Rather, they can be modified into various forms as long as the gist of the invention is not altered.

Throughout the present specification, in the case where each film, window, panel, layer, or the like is mentioned to be formed "on" or "under" another film, window, panel, layer, or the like, it means not only that one element is directly formed on or under another element, but also that one element is indirectly formed on or under another element with other element(s) interposed between them. In addition, the term on or under with respect to each element may be referenced to the drawings. For the sake of description, the sizes of individual elements in the appended drawings may be exaggeratedly depicted and do not indicate the actual sizes.

In this specification, when a part is referred to as "comprising" an element, it is to be understood that the part may comprise other elements as well, unless otherwise indicated.

All numbers and expressions relating to quantities of components, reaction conditions, and the like used herein are to be understood as being modified by the term "about" unless specifically stated otherwise.

The terms first, second, and the like are used herein to describe various elements, and the elements should not be limited by the terms. The terms are used only for the purpose of distinguishing one element from another.

In addition, the term "substituted" as used herein means to be substituted with at least one substituent group selected from the group consisting of deuterium, —F, —Cl, —Br, —I, a hydroxyl group, a cyano group, a nitro group, an amino group, an amidino group, a hydrazine group, a hydrazone group, an ester group, a ketone group, a carboxyl group, a substituted or unsubstituted alkyl group, a substituted or unsubstituted alkenyl group, a substituted or unsubstituted alkynyl group, a substituted or unsubstituted alkoxy group, a substituted or unsubstituted alicyclic organic group, a substituted or unsubstituted heterocyclic group, a substituted or unsubstituted aryl group, and a substituted or unsubstituted heteroaryl group. The substituent groups enumerated above may be connected to each other to form a ring.

Polyimide-Based Composite Film

Figure 1:
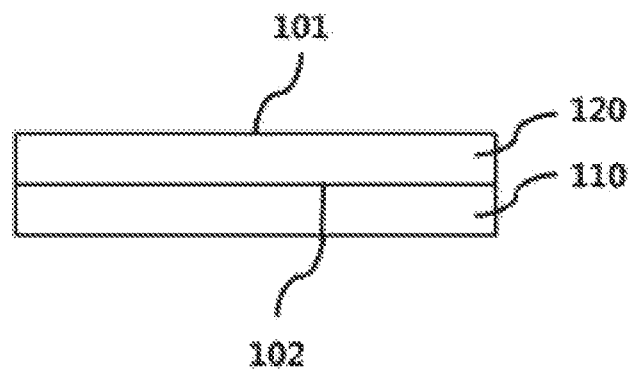
FIG. 1 is a cross-sectional view of a polyimide-based composite film according to an embodiment.

Referring to FIG. 1, the polyimide-based composite film according to an embodiment comprises a base film (110) and a functional layer (120) disposed on the base film (110).

The base film (110) may be a support layer that supports the functional layer (120). In addition, the base film (110) may comprise a polyimide-based resin. For example, the base film (110) may be a polyimide-based film.

The functional layer (120) may be formed as a coating on the base film (110). The functional layer (120) may be laminated on the base film (110). The functional layer (120) may be bonded on the base film (110).

The functional layer (120) may be a coating layer coated on the base film (110). The functional layer (120) may comprise a curable resin. Specifically, the functional layer (120) may be a curable coating layer.

The functional layer (120) may function to enhance the mechanical properties and/or optical properties of the base film (110). The functional layer may comprise an antireflection layer, an antifouling layer, a hard-coating layer, and a scratch-resistant layer.

As shown in FIG. 1, the functional layer (120) comprises a first side (101). The first side (101) is a side opposite to the side of the functional layer (120) on which the base film (110) is disposed. The first side (101) is a side located opposite to the side of the functional layer (120) in contact with the base film (110). The first side (101) may be the upper side of the functional layer (120). For example, the first side (101) may be the top side of the functional layer (120).

The base film (110) comprises a second side (102). The second side (102) is a side of the base film (110) on which the functional layer (120) is disposed. The second side (102) is a side of the base film (110) in contact with the functional layer (120). The second side (102) may be the upper side of the base film (110). For example, the second side (102) may be the top side of the base film (110).

In the polyimide-based composite film according to an embodiment, the functional layer (120) covers the second side (102). Thus, the shape of the second side (102) may be transferred to the lower side of the functional layer (120).

Base Film (110)

The base film (110) according to an embodiment comprises a polyimide-based resin. The base film (110) may further comprise a filler. For example, the base film (110) may comprise a polyimide-based resin and a filler.

The polyimide-based resin may be prepared by simultaneously or sequentially reacting reactants that comprise a diamine compound and a dianhydride compound. Specifically, the polyimide-based resin may comprise a polyimide polymer prepared by polymerizing a diamine compound and a dianhydride compound.

In addition, the polyimide-based resin may comprise a polyamide-imide polymer that contains an imide repeat unit derived from the polymerization of a diamine compound and a dianhydride compound and an amide repeat unit derived from the polymerization of a diamine compound and a dicarbonyl compound. Since the polyamide-imide polymer contains an imide repeat unit, it may fall under a polyimide-based resin in a broad sense.

The diamine compound is a compound that forms an imide bond with the dianhydride compound and forms an amide bond with the dicarbonyl compound, to thereby form a copolymer.

The diamine compound is not particularly limited, but it may be, for example, an aromatic diamine compound that contains an aromatic structure. For example, the diamine compound may be a compound represented by the following Formula 1.

$$H_2N\text{-}(E)_e\text{-}NH_2 \quad \text{[Formula 1]}$$

In Formula 1, E may be selected from a substituted or unsubstituted divalent $C_6$-$C_{30}$ aliphatic cyclic group, a substituted or unsubstituted divalent $C_4$-$C_{30}$ heteroaliphatic cyclic group, a substituted or unsubstituted divalent $C_6$-$C_{30}$ aromatic cyclic group, a substituted or unsubstituted divalent $C_4$-$C_{30}$ heteroaromatic cyclic group, a substituted or unsubstituted $C_1$-$C_{30}$ alkylene group, a substituted or unsubstituted $C_2$-$C_{30}$ alkenylene group, a substituted or unsubstituted $C_2$-$C_{30}$ alkynylene group, —O—, —S—, —C(=O)—, —CH(OH)—, —S(=O)$_2$—, —Si(CH$_3$)$_2$—, —C(CH$_3$)$_2$—, and —C(CF$_3$)$_2$—.

e is selected from integers of 1 to 5. When e is 2 or more, the Es may be the same as, or different from, each other.

$(E)_e$ in Formula 1 may be selected from the groups represented by the following Formulae 1-1a to 1-14a but it is not limited thereto.

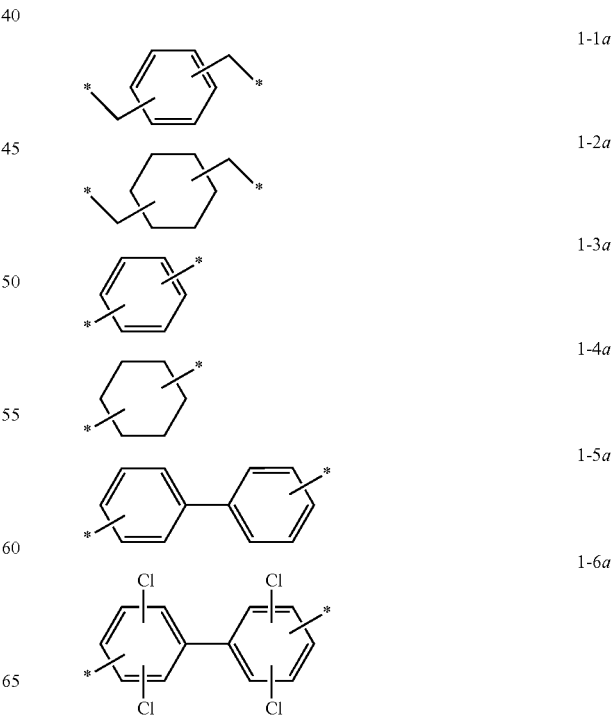

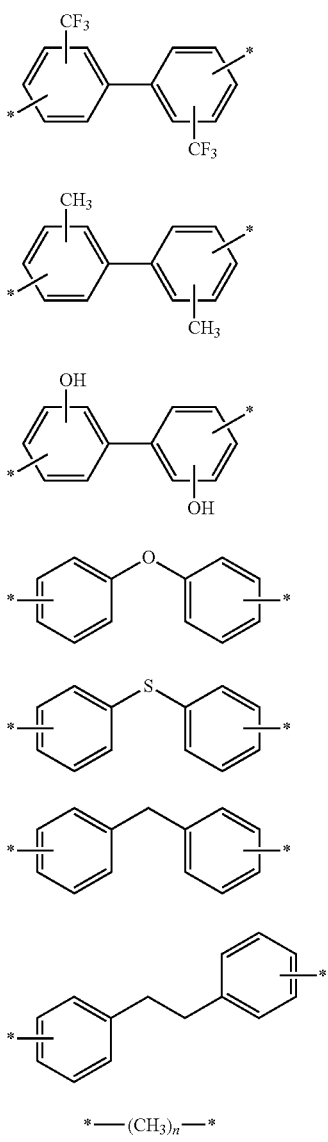

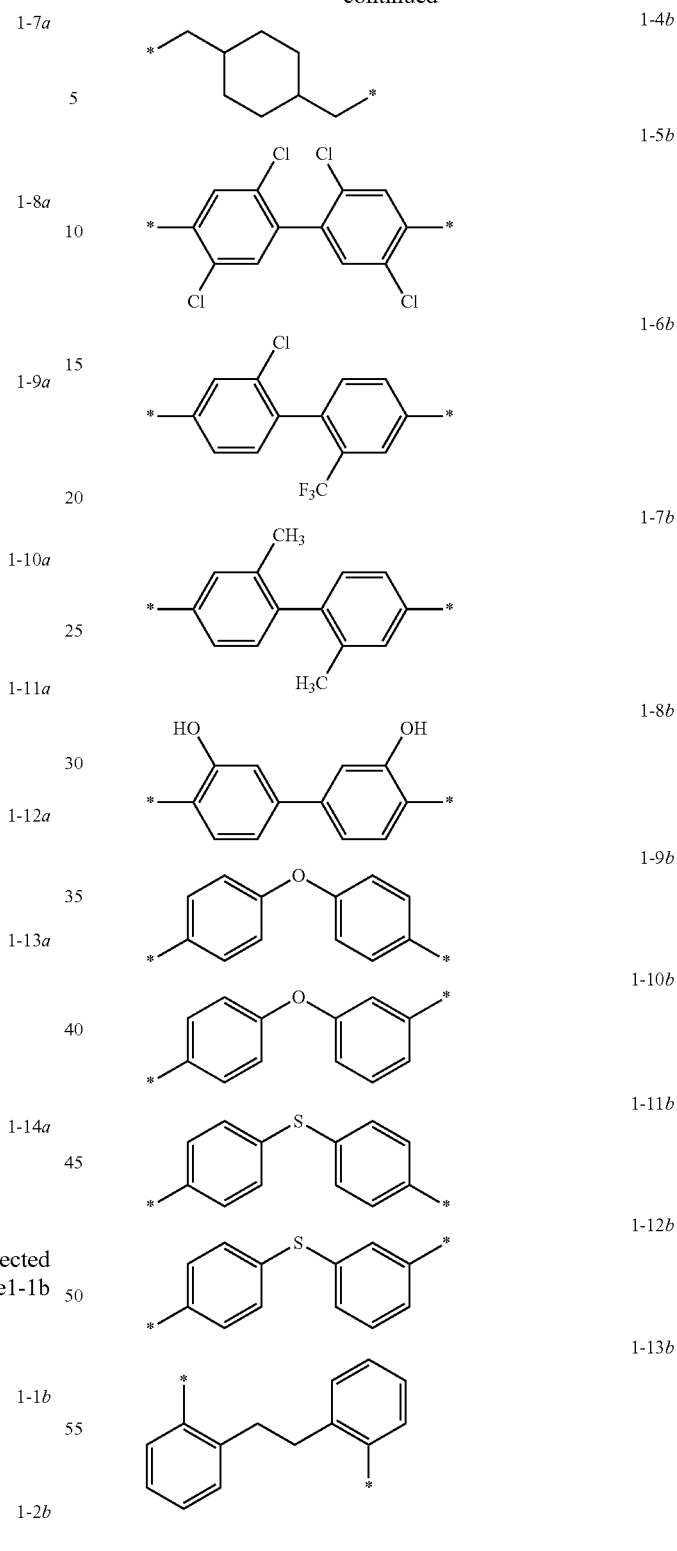

Specifically, (E)$_e$ in the above Formula 1 may be selected from the groups represented by the following Formula e1-1b to 1-13b, but it is not limited thereto.

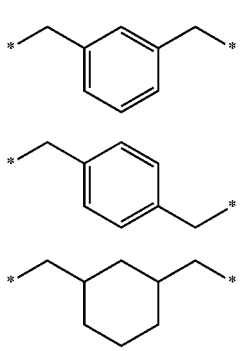

More specifically, (E)e in the above Formula 1 may be the group represented by the above Formula 1-6b.

In an embodiment, the diamine compound may comprise a compound having a fluorine-containing substituent. Alternatively, the diamine compound may be composed of a compound having a fluorine-containing substituent. In such event, the fluorine-containing substituent may be a fluorinated hydrocarbon group and specifically may be a trifluoromethyl group. But it is not limited thereto.

In another embodiment, one kind of diamine compound may be used as the diamine compound. That is, the diamine compound may be composed of a single component.

For example, the diamine compound may comprise 2,2'-bis(trifluoromethyl)-4,4'-diaminobiphenyl (TFDB) represented by the following formula, but it is not limited thereto.

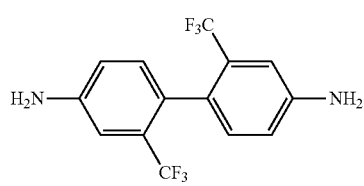

TFDB

The dianhydride compound has a low birefringence value, so that it can contribute to enhancements in the optical properties such as transmittance of a film that comprises the polyimide-based resin.

The dianhydride compound is not particularly limited, but it may be, for example, an aromatic dianhydride compound that contains an aromatic structure. For example, the aromatic dianhydride compound may be a compound represented by the following Formula 2.

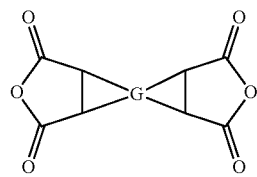

[Formula 2]

In Formula 2, G may be a substituted or unsubstituted tetravalent $C_6$-$C_{30}$ aliphatic cyclic group, a substituted or unsubstituted tetravalent $C_4$-$C_{30}$ heteroaliphatic cyclic group, a substituted or unsubstituted tetravalent $C_6$-$C_{30}$ aromatic cyclic group, or a substituted or unsubstituted tetravalent $C_4$-$C_{30}$ heteroaromatic cyclic group, wherein the aliphatic cyclic group, the heteroaliphatic cyclic group, the aromatic cyclic group, or the heteroaromatic cyclic group may be present alone, may be bonded to each other to form a condensed ring, or may be bonded by a bonding group selected from a substituted or unsubstituted $C_1$-$C_{30}$ alkylene group, a substituted or unsubstituted $C_2$-$C_{30}$ alkenylene group, a substituted or unsubstituted $C_2$-$C_{30}$ alkynylene group, —O—, —S—, —C(=O)—, —CH(OH)—, —S(=O)$_2$—, —Si(CH$_3$)$_2$—, —C(CH$_3$)$_2$—, and —C(CF$_3$)$_2$—.

G in the above Formula 2 may be selected from the groups represented by the following Formulae 2-1a to 2-9a, but it is not limited thereto.

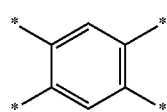

2-1a

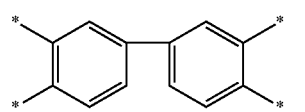

2-2a

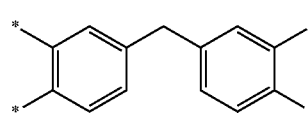

2-3a

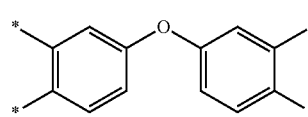

2-4a

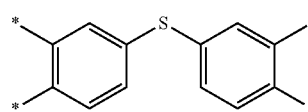

2-5a

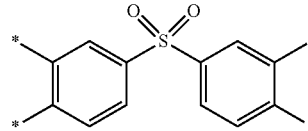

2-6a

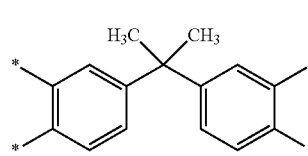

2-7a

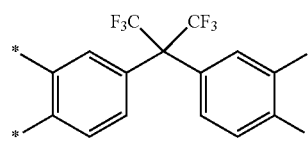

2-8a

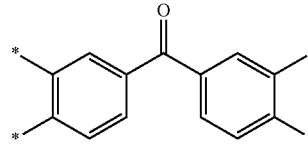

2-9a

For example, G in the above Formula 2 may be the group represented by the above Formula 2-8a.

In an embodiment, the dianhydride compound may comprise a compound having a fluorine-containing substituent. Alternatively, the dianhydride compound may be composed of a compound having a fluorine-containing substituent. In such event, the fluorine-containing substituent may be a fluorinated hydrocarbon group and specifically may be a trifluoromethyl group. But it is not limited thereto.

In another embodiment, the dianhydride compound may be composed of a single component or a mixture of two components.

For example, the dianhydride compound may comprise 2,2'-bis-(3,4-dicarboxyphenyl)hexafluoropropane dianhydride (6-FDA) represented by the following formula, but it is not limited thereto.

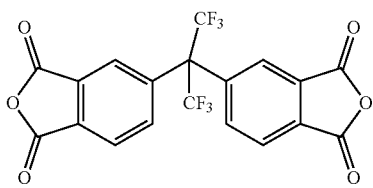

6-FDA

The diamine compound and the dianhydride compound may be polymerized to form a polyamic acid.

Subsequently, the polyamic acid may be converted to a polyimide through a dehydration reaction, and the polyimide comprises an imide repeat unit.

The polyimide may form a repeat unit represented by the following Formula A.

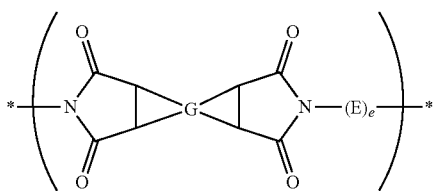

[Formula A]

In Formula A, E, G, and e are as described above.

For example, the polyimide may comprise a repeat unit represented by the following Formula A-1, but it is not limited thereto.

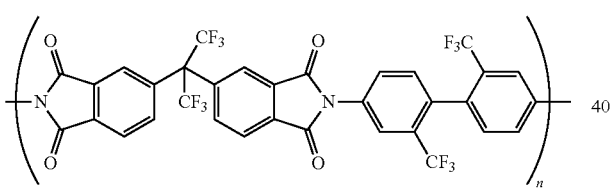

[Formula A-1]

In Formula A-1, n is an integer of 1 to 400.

The dicarbonyl compound is not particularly limited, but it may be, for example, a compound represented by the following Formula 3.

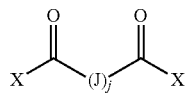

[Formula 3]

In Formula 3, J may be selected from a substituted or unsubstituted divalent $C_6$-$C_{30}$ aliphatic cyclic group, a substituted or unsubstituted divalent $C_4$-$C_{30}$ heteroaliphatic cyclic group, a substituted or unsubstituted divalent $C_6$-$C_{30}$ aromatic cyclic group, a substituted or unsubstituted divalent $C_4$-$C_{30}$ heteroaromatic cyclic group, a substituted or unsubstituted $C_1$-$C_{30}$ alkylene group, a substituted or unsubstituted $C_2$-$C_{30}$ alkenylene group, a substituted or unsubstituted $C_2$-$C_{30}$ alkynylene group, —O—, —S—, —C(=O)—, —CH(OH)—, —S(=O)$_2$—, —Si(CH$_3$)$_2$—, —C(CH$_3$)$_2$—, and —C(CF$_3$)$_2$—.

j is selected from integers of 1 to 5. When j is 2 or more, the Js may be the same as, or different from, each other.

X is a halogen atom. Specifically, X may be F, Cl, Br, I, or the like. More specifically, X may be Cl, but it is not limited thereto.

(J)$_j$ in Formula 3 may be selected from the groups represented by the following Formulae 3-1a to 3-14a, but it is not limited thereto.

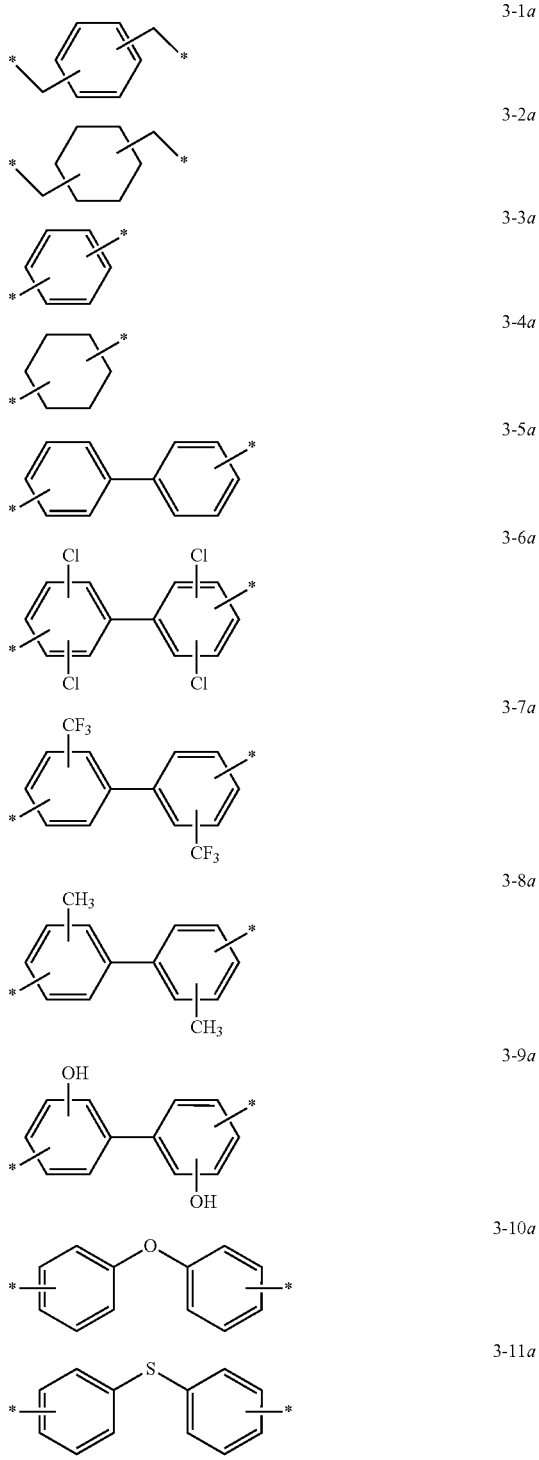

-continued

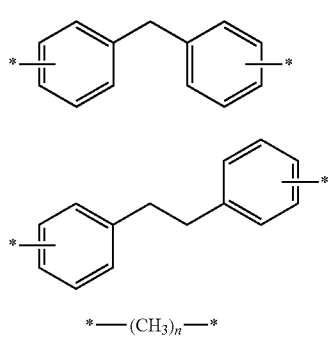

3-12a 3-13a 3-14a (n is selected from integers of 1 to 12)

Specifically, (J)$_j$ in the above Formula 3 may be selected from the groups represented by the following Formulae 3-1b to 3-8b, but it is not limited thereto.

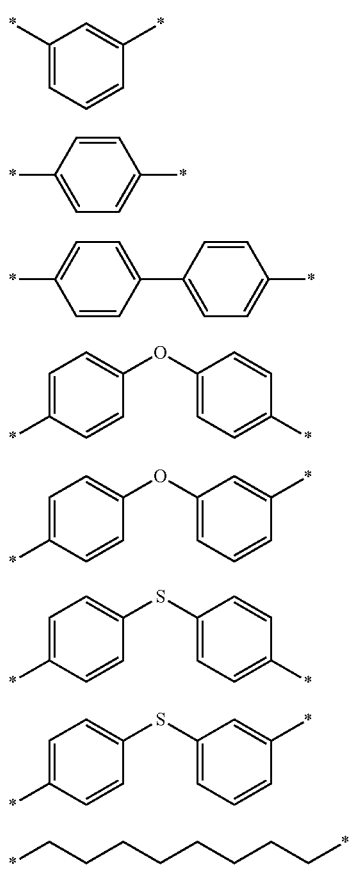

3-1b 3-2b 3-3b 3-4b 3-5b 3-6b 3-7b 3-8b

More specifically, (J) in the above Formula 3 may be the group represented by the above Formula 3-1b, the group represented by the above Formula 3-2b, or the group represented by the above Formula 3-3b.

In an embodiment, a mixture of at least two kinds of dicarbonyl compounds different from each other may be used as the dicarbonyl compound. If two or more dicarbonyl compounds are used, at least two dicarbonyl compounds in which (J)$_j$ in the above Formula 2 is selected from the groups represented by the above Formulae 3-1b to 3-8b may be used as the dicarbonyl compound.

In another embodiment, the dicarbonyl compound may be an aromatic dicarbonyl compound that contains an aromatic structure.

For example, the dicarbonyl compound may comprise a first dicarbonyl compound and/or a second dicarbonyl compound.

The first dicarbonyl compound and the second dicarbonyl compound may be an aromatic dicarbonyl compound, respectively.

The first dicarbonyl compound and the second dicarbonyl compound may be compounds different from each other.

For example, the first dicarbonyl compound and the second dicarbonyl compound may be aromatic dicarbonyl compounds different from each other, but they are not limited thereto.

If the first dicarbonyl compound and the second dicarbonyl compound are an aromatic dicarbonyl compound, respectively, they comprise a benzene ring. Thus, they can contribute to improvements in the mechanical properties such as surface hardness and tensile strength of a film thus produced that comprises the polyamide-imide resin.

The dicarbonyl compound may comprise terephthaloyl chloride (TPC), isophthaloyl chloride (IPC), and 1,1'-biphenyl-4,4'-dicarbonyl dichloride (BPDC), as represented by the following formulae, or a combination thereof. But it is not limited thereto.

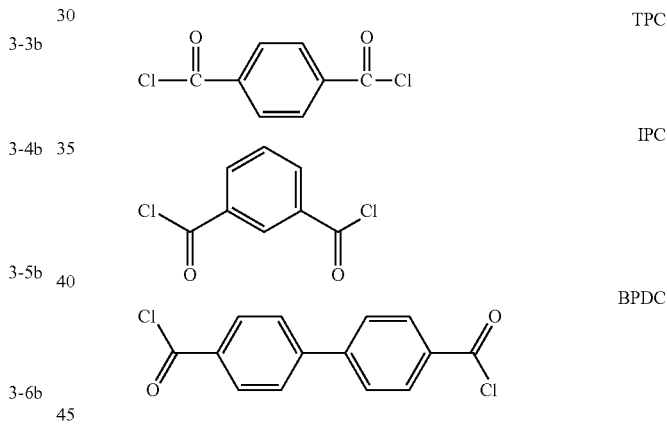

TPC

IPC

BPDC

For example, the first dicarbonyl compound may comprise BPDC, and the second dicarbonyl compound may comprise TPC, but they are not limited thereto.

Specifically, if BPDC is used as the first dicarbonyl compound and TPC is used as the second dicarbonyl compound in a proper combination, a film that comprises the polyamide-imide resin thus produced may have high oxidation resistance.

Alternatively, the first dicarbonyl compound may comprise IPC (isophthaloyl chloride), and the second dicarbonyl compound may comprise TPC, but they are not limited thereto.

Specifically, if IPC is used as the first dicarbonyl compound and TPC is used as the second dicarbonyl compound in a proper combination, a film that comprises the polyamide-imide resin thus produced may not only have high oxidation resistance, but is also economical since the costs can be reduced.

The diamine compound and the dicarbonyl compound may be polymerized to form a repeat unit represented by the following Formula B.

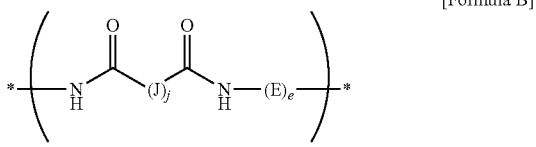

[Formula B]

In Formula B, E, J, e, and j are as described above.

For example, the diamine compound and the dicarbonyl compound may be polymerized to form amide repeat units represented by the following Formulae B-1 and B-2.

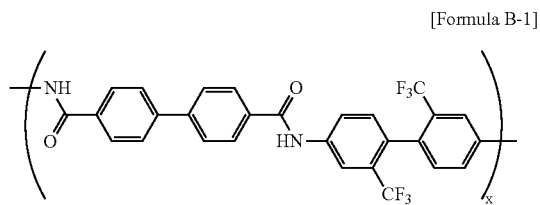

[Formula B-1]

In Formula B-1, x is an integer of 1 to 400.

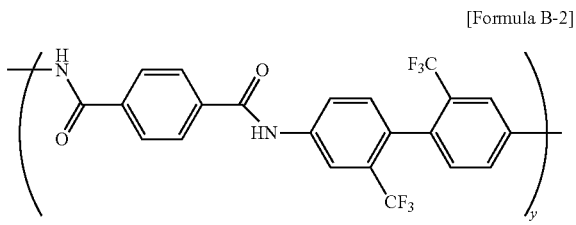

[Formula B-2]

In Formula B-2, y is an integer of 1 to 400.

The filler may be at least one selected from the group consisting of barium sulfate, silica, and calcium carbonate. As the base film comprises the filler, it is possible to enhance not only the surface roughness and winderability but also the effect of improving the scratches caused by sliding in the preparation of the film.

In addition, the filler may have a particle diameter of 0.01 μm to less than 1.0 μm. For example, the particle diameter of the filler may be 0.05 μm to 0.9 μm or 0.1 μm to 0.8 μm, but it is not limited thereto.

The base film may comprise the filler in an amount of 0.01 to 3% by weight based on the total weight of the base film. For example, the base film may comprise the filler in an amount of 0.05 to 2.5% by weight, 0.1 to 2% by weight, or 0.2 to 1.7% by weight, based on the total weight of the base film, but it is not limited thereto.

According to an embodiment, the Sz1 is 0.01 μm to 4 μm, and the Sz2 is 0.01 μm to 5 μm.

Specifically, the Sz1 may be 0.01 μm to 3 μm, 0.05 μm to 3 μm, or 0.1 μm to 3 μm, but it is not limited thereto. In addition, the Sz2 may be 0.01 μm to 4 μm, 0.05 μm to 4 μm, or 0.1 μm to 4 μm, but it is not limited thereto.

For example, the Sz1 may be 0.05 μm to 3 μm, and the Sz2 may be 0.05 m to 4 μm. Alternatively, the Sz1 may be 0.1 μm to 3 μm, and the Sz2 may be 0.1 μm to 4 μm.

The second side may be a side that has not been in direct contact with the casting body (30) for casting the polyimide-based resin in the process for preparing the base film. That is, the second side may be an air side in contact with the air when the polyimide-based resin is cast.

Unlike the above, the second side may be a side that has been in direct contact with the casting body (30) in the process for preparing the base film. That is, the second side may be a belt side in contact with the casting body, for example, a belt when the polyimide-based resin is cast.

The base film according to an embodiment is colorless, transparent, and enhanced in mechanical properties and optical properties such as haze, yellow index, and modulus.

According to an embodiment, the base film may have a haze of 3% or less. For example, the haze may be 2% or less, 1.5% or less, or 1% or less, but it is not limited thereto.

According to an embodiment, the base film may have a yellow index (YI) of 5 or less. For example, the yellow index may be 4 or less, 3.8 or less, 2.8 or less, 2.5 or less, 2.3 or less, or 2.1 or less, but it is not limited thereto.

According to an embodiment, the base film may have a modulus of 5 GPa or more. Specifically, the modulus may be 5.2 GPa or more, 5.5 GPa or more, 6.0 GPa or more, 10 GPa or less, 5 GPa to 10 GPa, or 7 GPa to 10 GPa, but it is not limited thereto.

According to an embodiment, the base film may have a transmittance of 80% or more. For example, the transmittance may be 85% or more, 88% or more, 89% or more, 80% to 99%, or 85% to 99%, but it is not limited thereto.

When the base film is perforated at a speed of 10 mm/min using a 2.5-mm spherical tip in a UTM compression mode, the maximum diameter (mm) of perforation including a crack is 60 mm or less. Specifically, the maximum diameter of perforation may be 5 to 60 mm, 10 to 60 mm, 15 to 60 mm, 20 to 60 mm, 25 to 60 mm, or 25 to 58 mm, but it is not limited thereto.

The base film has a compressive strength is 0.4 kgf/μm or more. Specifically, the compressive strength may be 0.45 kgf/sm or more, or 0.46 kgf/sm or more, but it is not limited thereto.

The base film has a surface hardness of HB or higher. Specifically, the surface hardness may be H or higher, or 2H or higher, but it is not limited thereto.

The base film has a tensile strength of 15 kgf/mm² or more. Specifically, the tensile strength may be 18 kgf/mm² or more, 20 kgf/mm² or more, 21 kgf/mm² or more, or 22 kgf/mm² or more, but it is not limited thereto.

The base film has an elongation of 15% or more. Specifically, the elongation may be 16% or more, 17% or more, or 17.5% or more, but it is not limited thereto.

The base film produced according to an embodiment has high oxidation resistance and can secure excellent optical properties such as high light transmittance, low haze, and low yellow index (YI). Further, it is possible to impart long-term stable mechanical properties to a substrate that requires flexibility in terms of modulus, elongation, tensile characteristics, and elastic restoring force.

Process for Preparing a Base Film (110)

Figure 3:
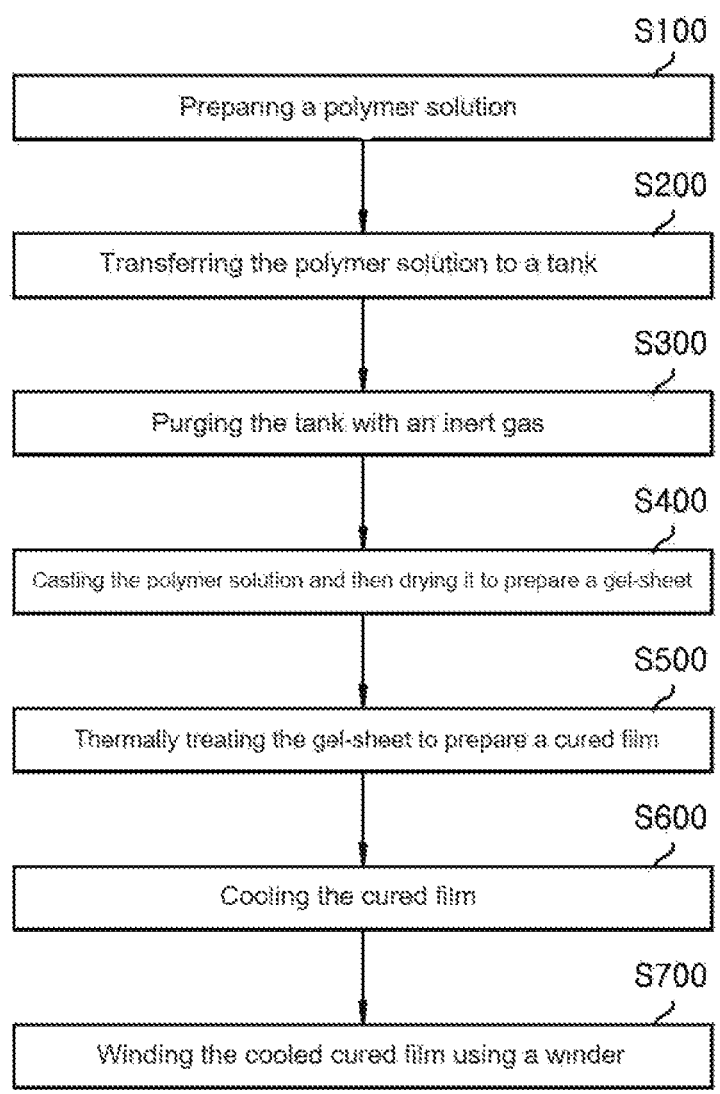
FIG. 3 is a schematic flow diagram of a process for preparing a base film according to an embodiment.

FIG. 3 is a schematic flow diagram of a process for preparing a base film according to an embodiment.

Referring to FIG. 3, the process for preparing a base film comprises simultaneously or sequentially mixing and reacting a diamine compound, a dianhydride compound, and a dicarbonyl compound in an organic solvent in a polymerization apparatus to prepare a polymer solution (S100); transferring the polymer solution to a tank (S200); purging with an inert gas (S300); casting the polymer solution in the tank onto a belt and then drying it to prepare a gel-sheet (S400); thermally treating the gel-sheet while it is moved to prepare a cured film (S500); cooling the cured film while it is moved (S600); and winding the cooled cured film using a winder (S700).

In the process for preparing the base film (110), the polymer solution is prepared by simultaneously or sequentially mixing and reacting a diamine compound, a dianhydride compound, and a dicarbonyl compound in an organic solvent in a polymerization apparatus (S100).

According to an embodiment, the polymer solution may be prepared by simultaneously mixing and reacting the diamine compound, the dianhydride compound, and the dicarbonyl compound in an organic solvent.

According to another embodiment, the step of preparing the polymer solution may comprise first mixing and reacting the diamine compound and the dianhydride compound in a solvent to produce a polyamic acid (PAA) solution; and second mixing and reacting the polyamic acid (PAA) solution and the dicarbonyl compound to form an amide bond and an imide bond at the same time. The polyamic acid solution is a solution that comprises a polyamic acid.

According to still another embodiment, the step of preparing the polymer solution may comprise first mixing and reacting the diamine compound and the dianhydride compound to produce a polyamic acid solution; subjecting the polyamic acid solution to dehydration to produce a polyimide (PI) solution; and second mixing and reacting the polyimide (PI) solution and the dicarbonyl compound to further form an amide bond. The polyimide solution is a solution that comprises a polymer having an imide repeat unit.

According to another embodiment, the step of preparing the polymer solution may comprise first mixing and reacting the diamine compound and the dicarbonyl compound to produce a polyamide (PA) solution; and second mixing and reacting the polyamide solution and the dianhydride compound to further form an imide bond. The polyamide solution is a solution that comprises a polymer having an amide repeat unit.

The polymer solution thus prepared may be a solution that comprises a polymer containing at least one selected from the group consisting of a polyamic acid (PAA) repeat unit, a polyamide (PA) repeat unit, and a polyimide (PI) repeat unit.

Alternatively, the polymer contained in the polymer solution comprises an imide repeat unit derived from the polymerization of the diamine compound and the dianhydride compound and an amide repeat unit derived from the polymerization of the diamine compound and the dicarbonyl compound.

According to an embodiment, the step of preparing the polymer solution may further comprise introducing a catalyst.

The catalyst may include, for example, beta picoline and/or acetic anhydride, but it is not limited thereto. The further addition of the catalyst may expedite the reaction rate and enhance the chemical bonding force between the repeat units or that within the repeat units.

In an embodiment, the step of preparing the polymer solution may further comprise adjusting the viscosity of the polymer solution.

Specifically, the step of preparing the polymer solution may comprise (a) simultaneously or sequentially mixing and reacting a diamine compound, a dianhydride compound, and a dicarbonyl compound in an organic solvent to prepare a first polymer solution; (b) measuring the viscosity of the first polymer solution and evaluating whether the target viscosity has been reached; and (c) if the viscosity of the first polymer solution does not reach the target viscosity, further adding the dicarbonyl compound to prepare a second polymer solution having the target viscosity.

The target viscosity may be 100,000 cps to 500,000 cps at room temperature. Specifically, the target viscosity may be 100,000 cps to 400,000 cps, 100,000 cps to 350,000 cps, 100,000 cps to 300,000 cps, 150,000 cps to 300,000 cps, or 150,000 cps to 250,000 cps, but it is not limited thereto.

In another embodiment, the content of solids contained in the polymer solution may be 10% by weight to 20% by weight. Specifically, the content of solids contained in the second polymer solution may be 12% by weight to 18% by weight, but it is not limited thereto.

If the content of solids contained in the polymer solution is within the above range, a base film can be effectively produced in the extrusion and casting steps. In addition, the base film thus produced may have mechanical properties in terms of an improved modulus and the like and optical properties in terms of a low yellow index and the like.

In an embodiment, the step of preparing the polymer solution may further comprise adjusting the pH of the polymer solution. In this step, the pH of the polymer solution may be adjusted to 4 to 7 or 4.5 to 7, but it is not limited thereto.

The pH of the polymer solution may be adjusted by adding a pH adjusting agent. The pH adjusting agent is not particularly limited and may include, for example, amine compounds such as alkoxyamine, alkylamine, and alkanolamine.

If the pH of the polymer solution is adjusted to the above range, it is possible to prevent the damage to the equipment in the subsequent process, to prevent the occurrence of defects in the film produced from the polymer solution, and to achieve the desired optical properties and mechanical properties in terms of yellow index and modulus.

The pH adjusting agent may be employed in an amount of 0.1% by mole to 10% by mole based on the total number of moles of monomers in the polymer solution, but it is not limited thereto.

The step of preparing the polymer solution may further comprise purging with an inert gas. The step of purging with an inert gas may remove moisture, reduce impurities, increase the reaction yield, and impart excellent surface appearance and mechanical properties to the film finally produced.

In such event, the inert gas may be at least one selected from the group consisting of nitrogen, helium (He), neon (Ne), argon (Ar), krypton (Kr), xenon (Xe), and radon (Rn), but it is not limited thereto. Specifically, the inert gas may be nitrogen.

The polyimide-based resin used to prepare the polymer solution may have a molar ratio of the imide repeat unit to the amide repeat unit of 20:80 to 80:20, for example, 20:80 to 50:50. In such event, the imide repeat unit may be a repeat unit represented by the above Formula A, and the amide repeat unit may be a repeat unit represented by the above Formula B.

If the molar ratio of the polyimide-based resin satisfies the above range, it is easy to control the viscosity of the polymer solution by using the monomers as described above for preparing the same. As a result, it is easy to produce a uniform film without defects on the surface of the gel-sheet and the cured film.

It is possible to produce a polyimide-based film whose optical properties, mechanical properties, and flexibility are improved in a well-balanced manner without a complicated process by properly controlling the content of the imide repeat unit and that of the amide repeat unit. In addition, it is possible to provide a polyimide-based film whose optical properties, mechanical properties, and flexibility are improved in a well-balanced manner without such steps as precipitation, filtration, drying, and redissolution as adopted in the prior art. The content of the imide repeat unit and that of the amide repeat unit may be controlled by the amounts of the aromatic dianhydride and the dicarbonyl compound, respectively.

Figure 4:
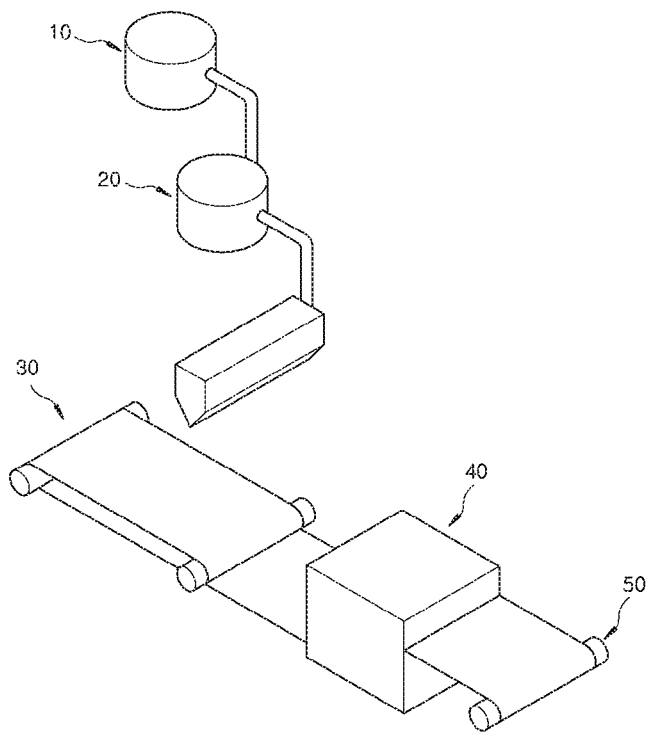
FIG. 4 schematically illustrates process facilities for preparing a base film according to an embodiment.

FIG. 4 schematically illustrates process facilities for preparing a base film according to an embodiment.

Specifically, the polymer solution as described above is prepared in a polymerization apparatus (10), and the polymer solution thus produced is transferred to, and stored in, a tank (20) (S200). Here, once the polymer solution has been prepared, the step of transferring the polymer solution to the tank is carried out without any additional steps.

The polymer solution prepared in the polymerization apparatus is transferred to, and stored in, the tank without any separate precipitation and redissolution steps for removing impurities. In the conventional process, in order to remove impurities such as hydrochloric acid (HCl) generated during the preparation of a polymer solution, the polymer solution thus prepared is purified through a separate step to remove the impurities, and the purified polymer solution is then redissolved in a solvent. In this case, however, there has been a problem that the loss of the active ingredient increases in the step of removing the impurities, resulting in decreases in the yield.

Accordingly, the preparation process according to an embodiment ultimately minimizes the amount of impurities generated in the step of preparing the polymer solution or properly controls the impurities in the subsequent steps, even if a certain amount of impurities is present, so as not to deteriorate the physical properties of the final film. Thus, the process has an advantage in that a film is produced without separate precipitation or redissolution steps. In addition, the polymer solution is not ought to be subjected to such separate steps as precipitation, filtration, drying, and redissolution. Since the solution produced in the polymerization step can be directly applied to the casting step, the yield can be remarkably enhanced.

The tank (20) is a place for storing the polymer solution before forming it into a film, and its internal temperature may be −20° C. to 20° C.

Specifically, the internal temperature may be −20° C. to 15° C., −20° C. to 10° C., −20° C. to 5° C., or −20° C. to 0° C., but it is not limited thereto.

If the temperature of the tank (20) is controlled to the above range, it is possible to prevent the polymer solution from deteriorating during storage, and it is possible to lower the moisture content to thereby prevent defects of the film produced therefrom.

The process for preparing a base film may further comprise carrying out vacuum degassing of the polymer solution transferred to the tank (20).

The vacuum degassing may be carried out for 30 minutes to 3 hours after depressurizing the internal pressure of the tank to 0.1 to 0.7 bar. The vacuum degassing under these conditions may reduce bubbles in the polymer solution. As a result, it is possible to prevent surface defects of the film produced therefrom and to achieve excellent optical properties such as haze.

In addition, the process for preparing a polyimide-based film may further comprise purging the polymer solution transferred to the tank (20) with an inert gas (S300).

Specifically, the purging is carried out by purging the tank with an inert gas at an internal pressure of 1 atm to 2 atm. The nitrogen purging under these conditions may remove moisture in the polymer solution, reduce impurities to thereby increase the reaction yield, and achieve excellent optical properties such as haze and mechanical properties.

The step of vacuum degassing and the step of purging the tank with nitrogen gas are performed in a separate process, respectively.

For example, the step of vacuum degassing may be carried out, followed by the step of purging the tank with nitrogen gas, but it is not limited thereto.

The step of vacuum degassing and/or the step of purging the tank with nitrogen gas may improve the physical properties of the surface of the polyimide-based film thus produced.

Thereafter, the process may further comprise storing the polymer solution in the tank (20) for 12 hours to 360 hours. Here, the temperature inside the tank may be kept at −20° C. to 20° C.

The process for preparing a base film may further comprise casting the polymer solution in the tank and then drying it to prepare a gel-sheet (S400).

The polymer solution may be cast onto a casting body such as a casting roll or a casting belt.

Referring to FIG. 4, in an embodiment, the polymer solution may be applied onto a casting belt (30) as a casting body, and it is dried while it is moved to be made into a sheet in the form of a gel.

When the polymer solution is injected onto the belt (30), the injection amount may be 300 g/min to 700 g/min. If the injection amount of the polymer solution satisfies the above range, the gel-sheet can be uniformly formed to an appropriate thickness.

In addition, the casting thickness of the polymer solution may be 200 to 700 μm. If the polymer solution is cast to a thickness within the above range, the final film produced after the drying and thermal treatment may have an appropriate and uniform thickness.

The polymer solution is cast and then dried at a temperature of 60° C. to 150° C. for 5 minutes to 60 minutes to prepare a gel-sheet. The solvent of the polymer solution is partially or totally volatilized during the drying to prepare the gel-sheet.

As described above, the viscosity of the polymer solution at room temperature may be 100,000 cps to 500,000 cps, for example, 100,000 cps to 400,000 cps, for example, 100,000 cps to 350,000 cps, for example, 150,000 cps to 350,000 cps. If the viscosity satisfies the above range, the polymer solution can be cast onto a belt in a uniform thickness without defects.

The process for preparing a base film comprises thermally treating the gel-sheet while it is moved to prepare a cured film (S500).

Referring to FIG. 4, the thermal treatment of the gel-sheet may be carried out by passing it through a thermal curing device (40).

The thermal treatment of the gel-sheet may be carried out in a temperature range of 80° C. to 500° C. at a temperature elevation rate of 2° C./min to 80° C./min for 5 minutes to 40 minutes. Specifically, the thermal treatment of the gel-sheet may be carried out in a temperature range of 80° C. to 470° C. at a temperature elevation rate of 10° C./min to 80° C./min for 5 minutes to 30 minutes, but it is not limited thereto.

In such event, the initial temperature of the thermal treatment of the gel-sheet may be 80° C. or higher, and the maximum temperature in the thermal treatment may be 300° C. to 500° C. For example, the maximum temperature in the thermal treatment may be 350° C. to 500° C., 380° C. to 500° C., 400° C. to 500° C., 410° C. to 480° C., 410° C. to 470° C., or 410° C. to 450° C.

That is, referring to FIG. 4, the inlet temperature of the thermal curing device (40) may be the initial temperature of the thermal treatment, and the temperature of a certain region inside the thermal curing device (40) may be the maximum temperature in the thermal treatment.

The thermal treatment under these conditions may cure the gel-sheet to have appropriate surface hardness and modulus and may secure high light transmittance and low haze of the cured film at the same time.

The process for preparing a base film comprises cooling the cured film while it is moved (S600).

Referring to FIG. 4, the cooling of the cured film is carried out after it has been passed through the thermal curing device (40). It may be carried out by using a separate cooling chamber (not shown) or by forming an appropriate temperature atmosphere without a separate cooling chamber.

The step of cooling the cured film while it is moved may comprise a first temperature lowering step of reducing the temperature at a rate of 100° C./min to 1,000° C./min and a second temperature lowering step of reducing the temperature at a rate of 40° C./min to 400° C./min.

In such event, specifically, the second temperature lowering step is performed after the first temperature lowering step. The temperature lowering rate of the first temperature lowering step may be faster than the temperature lowering rate of the second temperature lowering step.

For example, the maximum rate of the first temperature lowering step is faster than the maximum rate of the second temperature lowering step. Alternatively, the minimum rate of the first temperature lowering step is faster than the minimum rate of the second temperature lowering step.

If the step of cooling the cured film is carried in such a multistage manner, it is possible to have the physical properties of the cured film further stabilized and to maintain the optical properties and mechanical properties of the film achieved during the curing step more stably for a long period of time.

The moving speed of the gel-sheet and the moving speed of the cured film are the same.

The process for preparing a base film comprises winding the cooled cured film using a winder (S700).

Referring to FIG. 4, the cooled cured film may be wound using a roll-shaped winder (50).

In such event, the ratio of the moving speed of the gel-sheet on the belt at the time of drying to the moving speed of the cured film at the time of winding is 1:0.95 to 1:1.40. Specifically, the ratio of the moving speeds may be 1:0.99 to 1:1.20, 1:0.99 to 1:1.10, 1:1.01 to 1:1.10, or 1:1.05 to 1:1.10, but it is not limited thereto.

If the ratio of the moving speeds is outside the above range, the mechanical properties of the cured film may be impaired, and the flexibility and elastic properties may be deteriorated.

Specifically, the moving speed of the gel-sheet on the belt at the time of drying may be 0.1 m/min to 15 m/min, for example, 0.5 m/min to 10 m/min.

In the process for preparing a base film, the thickness variation (%) according to the following Relationship 1 may be 3% to 30%, for example, 5% to 20%, but it is not limited thereto.

Thickness variation (%)=($M1-M2$)/$M2$×100   [Relationship 1]

In Relationship 1, M1 is the thickness (μm) of the gel-sheet, and M2 is the thickness (μm) of the cooled cured film at the time of winding.

The physical properties of the base film as described above are based on a thickness of 40 μm to 60 μm. For example, the physical properties of the base film are based on a thickness of 50 μm.

The base film prepared by the preparation process as described above is excellent in optical properties and mechanical properties. The base film may be applicable to various uses that require flexibility and transparency. For example, the base film may be applied to solar cells, displays, semiconductor devices, sensors, and the like.

Functional Layer (120)

The functional layer (120) may comprise an organic resin, an inorganic filler, and other additives.

The organic resin may be a curable resin. The organic resin may be a binder resin. The organic resin may be at least one selected from the group consisting of an acrylate-based monomer, a urethane acrylate-based oligomer, and an epoxy acrylate-based oligomer.

The acrylate-based monomer may be at least one selected from the group consisting of a substituted or unsubstituted acrylate and a substituted or unsubstituted methacrylate.

The acrylate-based monomer may contain 1 to 10 functional groups. The urethane acrylate-based oligomer may contain 2 to 15 functional groups. The epoxy acrylate-based oligomer may contain 1 to 10 functional groups.

Examples of the acrylate-based monomers include trimethylolpropane triacrylate (TMPTA), trimethylolpropaneethoxy triacrylate (TMPEOTA), glycerin propoxylated triacrylate (GPTA), pentaerythritol tetraacrylate (PETA), and dipentaerythritol hexaacrylate (DPHA).

Examples of the urethane acrylate-based oligomer include a bifunctional urethane acrylate oligomer having a weight average molecular weight of 1,400 to 25,000, a trifunctional urethane acrylate oligomer having a weight average molecular weight of 1,700 to 16,000, a tetra-functional urethane acrylate oligomer having a weight average molecular weight of 1000, a hexa-functional urethane acrylate oligomer having a weight average molecular weight of 818 to 2,600, an ennea-functional urethane acrylate oligomer having a weight average molecular weight of 3,500 to 5,500, a deca-functional urethane acrylate oligomer having a weight average molecular weight of 3,200 to 3,900, and a pentakai-deca-functional urethane acrylate oligomer having a weight average molecular weight of 2,300 to 20,000.

Examples of the epoxy acrylate-based oligomer include a monofunctional epoxy acrylate oligomer having a weight average molecular weight of 100 to 300, a bifunctional epoxy acrylate oligomer having a weight average molecular weight of 250 to 2,000, and a tetra-functional epoxy acrylate oligomer having a weight average molecular weight of 1,000 to 3,000.

The acrylate-based monomer may have a weight average molecular weight (Mw) of about 200 to about 2,000 g/mole, about 200 to about 1,000 g/mole, or about 200 to about 500 g/mole.

The acrylate equivalent weight of the acrylate-based monomer may range from about 50 to about 300 g/eq, from about 50 to about 200 g/eq, or from about 50 to about 150 g/eq.

The epoxy equivalent weight of the epoxy acrylate-based oligomer may range from about 50 to about 300 g/eq, from about 50 to about 200 g/eq, or from about 50 to about 150 g/eq.

The content of the organic resin may be 30% by weight to 100% by weight based on the total weight of the functional layer. Specifically, the content of the organic resin may be 40% by weight to 90% by weight, or 50% by weight to 80% by weight, based on the total weight of the functional layer.

Examples of the inorganic filler include silica, barium sulfate, zinc oxide, and alumina.

The inorganic filler may have a particle diameter of 1 nm to 100 nm. Specifically, the particle diameter of the inorganic filler may be 5 nm to 50 nm or 10 nm to 30 nm.

The inorganic filler may comprise inorganic fillers having particle size distributions different from each other. For example, the inorganic filler may comprise a first inorganic filler having a d50 of 20 to 35 nm and a second inorganic filler having a d50 of 40 to 130 nm.

The content of the inorganic filler may be about 25% by weight or more, about 30% by weight or more, or about 35% by weight or more, based on the total weight of the functional layer. In addition, the content of the inorganic filler may be about 50% by weight or less, about 45% by weight or less, or about 40% by weight or less, based on the total weight of the functional layer.

The inorganic filler may be subjected to surface treatment. The inorganic filler may be subjected to surface treatment with a silane coupling agent or the like. Examples of the silane coupling agent include (meth)acrylsilane, methacroxysilane, vinylsilane, epoxysilane, and mercaptosilane.

The functional layer may further comprise a photoinitiator.

Examples of the photoinitiator include 1-hydroxy-cyclohexyl-phenyl ketone, 2-hydroxy-2-methyl-1-phenyl-1-propanone, 2-hydroxy-1-[4-(2-hydroxyethoxy)phenyl]-2-methyl-1-propanone, methylbenzoylformate, $\alpha,\alpha$-dimethoxy-a-phenylacetophenone, 2-benzoyl-2-(dimethylamino)-1-[4-(4-morpholinyl)phenyl]-1-butanone, 2-methyl-1-[4-(methylthio)phenyl]-2-(4-morpholinyl)-1-propanone, diphenyl(2,4,6-trimethylbenzoyl)-phosphine oxide, and bis(2,4,6-trimethylbenzoyl)-phenylphosphine oxide, but it is not limited thereto. In addition, commercially available products include Irgacure 184, Irgacure 500, Irgacure 651, Irgacure 369, Irgacure 907, Darocur 1173, Darocur MBF, Irgacure 819, Darocur TPO, Irgacure 907, and Esacure KIP 100F. The photoinitiator may be used alone or in combination of two or more different types.

The functional layer may comprise a surfactant, a UV absorber, a UV stabilizer, an anti-yellowing agent, a leveling agent, an antifouling agent, or a dye for improving chromaticity values as other additives. In addition, the content of the additives may be variously adjusted within a range that does not deteriorate the physical properties of the functional layer. For example, the content of the additives may be about 0.01% by weight to about 10% by weight based on the total weight of the functional layer, but it is not limited thereto.

The surfactant may be a mono- to bifunctional fluorine-based acrylate, a fluorine-based surfactant, or a silicone-based surfactant. The surfactant may be employed in a form dispersed or crosslinked in the functional layer.

Examples of the UV absorber include benzophenone-based compounds, benzotriazole-based compounds, and triazine-based compounds. Examples of the UV stabilizer include tetramethyl piperidine and the like.

A coating composition may be prepared in order to form the functional layer. The coating composition comprises the organic resin, the inorganic filler, the additives, and an organic solvent.

Examples of the organic solvent include alcohol-based solvents such as methanol, ethanol, isopropyl alcohol, and butanol; alkoxy alcohol-based solvents such as 2-methoxyethanol, 2-ethoxyethanol, and 1-methoxy-2-propanol; ketone-based solvents such as acetone, methyl ethyl ketone, methyl isobutyl ketone, methyl propyl ketone, and cyclohexanone; ether-based solvent such as propylene glycol monopropyl ether, propylene glycol monomethyl ether, ethylene glycol monoethyl ether, ethylene glycol monopropyl ether, ethylene glycol monobutyl ether, diethylene glycol monomethyl ether, diethylene glycol monoethyl ether, diethylene glycol monopropyl ether, diethylene glycol monobutyl ether, and diethylene glycol-2-ethylhexyl ether; and aromatic solvents such as benzene, toluene, and xylene, which may be used alone or in combination thereof.

The content of the organic solvent is not particularly limited since it may be variously adjusted within a range that does not deteriorate the physical properties of the coating composition. The organic solvent may be employed such that the weight ratio of the solids content of the components contained in the coating composition to the organic solvent may be about 30:70 to about 99:1. If the content of the organic solvent is within the above range, the composition may have appropriate fluidity and coatability.

Since the organic solvent is used in the course of preparing the functional layer, a trace amount of the organic solvent may remain in the functional layer.

The coating composition may be applied to the front or rear side of the base film. The coating composition may be coated by a bar coating method, a knife coating method, a roll coating method, a blade coating method, a die coating method, a microgravure coating method, a comma coating method, a slot die coating method, a lip coating method, or a solution casting method.

Thereafter, the organic solvent contained in the coating composition may be removed. The organic solvent may be removed by evaporation.

Thereafter, the coating composition layer may be cured by light and/or heat.

The functional layer upon complete curing thereof may have a thickness of about 2 μm or more, or about 3 μm or more, for example, about 2 to about 20 μm, about 2 to about 15 μm, about 2 to about 10 μm, or about 3 to about 10 μm.

An additional layer may be further disposed between the base film and the functional layer. The additional layer may be an antistatic layer, which performs an antistatic function, or may be a low refractive index layer, which performs a low reflection function. Alternatively, the functional layer itself may perform an antistatic function and/or a low reflection function.

Physical Properties of the Polyimide-Based Composite Film

The polyimide-based composite film according to an embodiment has a leveling index represented by the following Equation 1 of less than 0.75.

$$\text{Leveling index} = \frac{Sz2 - Sz1}{Sz2 + Sz1} \quad \text{[Equation 1]}$$

Here, Sz1 is the Sz roughness (μm) of the first side, and Sz2 is the Sz roughness (μm) of the second side.

In an embodiment, the Sz2 may be 0.01 μm to 5 μm, and the Sz1 may be 0.01 μm to 4 μm.

In an embodiment, the Sz2 may be 0.05 μm to 4 μm, and the Sz1 may be 0.05 μm to 3 μm.

In an embodiment, the Sz2 may be 0.1 μm to 4 μm, and the Sz1 may be 0.1 μm to 3 μm.

In an embodiment, the leveling index may be 0.11 to 0.7.

In an embodiment, the leveling index may be less than 0.7.

In an embodiment, the leveling index may be less than 0.65.

In another embodiment, the leveling index may be 0.53 or more.

If the polyimide-based composite film has a leveling index as described above, the functional layer may reduce the defect that cracks may be generated during the stretching process.

In an embodiment, the functional layer has a thickness of 2 μm to 10 μm and an FT represented by the following Equation 2 of less than 0.7:

$$FT = \frac{Sz2}{Th} \quad \text{[Equation 2]}$$

Here, Th is the thickness (μm) of the functional layer.

Specifically, the FT represented by the above Equation 2 may be less than 0.6, less than 0.55, 0.13 to 0.6, or 0.14 to 0.6, but it is not limited thereto.

In addition, if the polyimide-based composite film has an FT value as described above, the functional layer may reduce the defect that cracks may be generated during the stretching process.

In an embodiment, the functional layer may have an elongation of 2% or more. Specifically, the elongation of the functional layer may be 2.5% or more, 3% or more, 2% to 20%, or 2.5% to 15%, but it is not limited thereto.

In an embodiment, the surface polarity index (SP) represented by the following Equation 3 may be 1/40 or more.

$$SP = \frac{|A1 - A2|}{A1 + A2} \quad \text{[Equation 3]}$$

Here, A1 is the contact angle of the first side, and A2 is the contact angle of the second side.

Specifically, the surface polarity index (SP) represented by the above Equation 3 may be 0.08 or more, 0.09 to 0.25, or 0.1 to 0.2, but it is not limited thereto.

In addition, if the polyimide-based composite film has a surface polarity index as described above, the functional layer may reduce the defect.

In an embodiment, the polyimide-based composite film may have a haze of 3% or less, a yellow index (YI) of 5 or less, a modulus of 5 GPa or more, and a transmittance of 80% or more.

Figure 5:
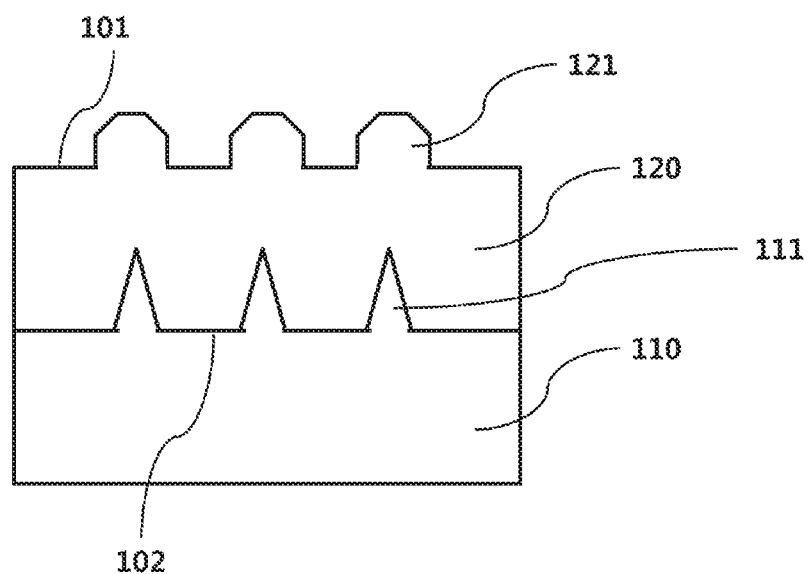
FIG. 5 is a cross-sectional view of a polyimide-based composite film according to an embodiment.

As shown in FIG. 5, if the second side (102) comprises a second protrusion (111), the first side (101) may comprise a first protrusion (121) so as to correspond to the second protrusion (111). As a result, the functional layer (120) may reduce the defect that the thickness is extremely thin.

In addition, if the above leveling index is satisfied, the functional layer may have high resistance to tensile force in the horizontal direction. For example, the functional layer may have the first protrusion so as to correspond to the second protrusion. Accordingly, when the cross-section of the functional layer is viewed in the horizontal direction, it may have a zigzag shape. As a result, the functional layer may have high mechanical strength against deformation in the horizontal direction.

Since the polyimide-based composite film according to an embodiment has a leveling index as described above, the first side and the second side may have an appropriate range of roughness. As a result, the functional layer may have enhanced mechanical strength. Specifically, the functional layer may have an elongation of 2% or more.

The polyimide-based composite film according to an embodiment may have enhanced mechanical properties and optical properties.

Display Device

The display device according to an embodiment comprises a display panel; and a cover window disposed on the display panel, wherein the cover window comprises a base film and a functional layer disposed on the base film.

When the side of the functional layer located opposite to the side in contact with the base film is referred to as a first side and when the side of the base film in contact with the functional layer is referred to as a second side, the leveling index represented by the above Equation 1 is less than 0.75.

Here, the details on the base film, the functional layer, and the like are as described above.

Figure 2:
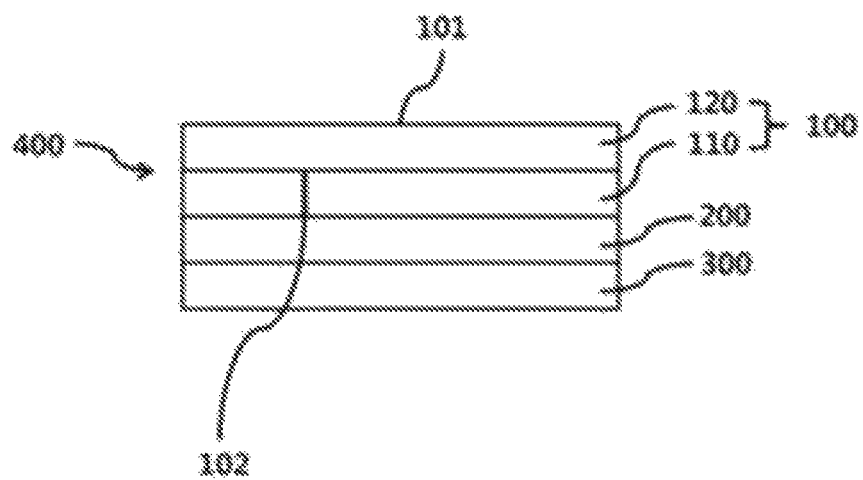
FIG. 2 is a cross-sectional view of a display device according to an embodiment.

FIG. 2 is a cross-sectional view of a display device according to an embodiment. Specifically, FIG. 2 illustrates a cross-section of a display device, which comprises a display panel (300) and a cover window (100) disposed on the display panel (300), wherein the cover window (100) comprises a base film (110) and a functional layer (120), and an adhesive layer (200) is interposed between the display panel (300) and the cover window (100). The functional layer (120) is disposed on the viewing side with respect to the base film (110).

The display panel (300) is for displaying an image, and it may have flexible characteristics.

The display panel (300) may be a display panel for displaying an image. For example, it may be a liquid crystal display panel or an organic electroluminescent display panel. Specifically, the organic electroluminescent display panel may comprise a front polarizing plate and an organic EL panel, but it is not limited thereto.

The front polarizing plate may be disposed on the front side of the organic EL panel. Specifically, the front polarizing plate may be attached to the side on which an image is displayed in the organic EL panel.

The organic EL panel displays an image by self-emission of a pixel unit. The organic EL panel may comprise an organic EL substrate and a driving substrate. The organic EL substrate may comprise a plurality of organic electroluminescent units, each of which corresponds to a pixel. Specifically, it may comprise a cathode, an electron transport layer, a light-emitting layer, a hole transport layer, and an anode. The driving substrate is operatively coupled to the organic EL substrate. That is, the driving substrate may be coupled to the organic EL substrate so as to apply a driving signal such as a driving current, so that the driving substrate can drive the organic EL substrate by applying a current to the respective organic electroluminescent units.

According to an embodiment, an adhesive layer (200) may be interposed between the display panel (300) and the cover window (100). The adhesive layer (200) may be an optically transparent adhesive layer, but it is not particularly limited.

The cover window (100) is disposed on the display panel (300). The cover window (100) is located at the outermost position of the display device according to an embodiment to thereby protect the display panel (300).

The cover window (100) may comprise the base film (110) and the functional layer (120). The functional layer (120) may be at least one selected from the group consisting of a hard coating layer, a reflectance reducing layer, an antifouling layer, and an antiglare layer. The functional layer (120) may be coated on at least one side of the base film (110).

Hereinafter, the above description will be described in detail by referring to examples. But the following Examples are intended to illustrate the present invention, and the scope of the Examples is not limited thereto only.

EXAMPLE

Example 1

A 1,000-liter glass reactor equipped with a temperature-controllable double jacket was charged with 250 kg of dimethylacetamide (DMAc) as an organic solvent at 20° C. under a nitrogen atmosphere. Then, 32.02 kg of 2,2'-bis(trifluoromethyl)-4,4'-diaminobiphenyl (TFDB) as an aromatic diamine was slowly added thereto and dissolved.

Subsequently, while 13.3 kg of 2,2'-bis(3,4-dicarboxyphenyl)hexafluoropropane dianhydride (6-FDA) as an aromatic dianhydride was slowly added thereto, the mixture was stirred for 1 hour.

Then, 700 g of barium sulfate as a filler was added thereto, followed by stirring for 1 hour.

Then, 12.56 kg of 1,1'-biphenyl-4,4'-dicarbonyldichloride (BPDC) as a first dicarbonyl compound was added, followed by stirring for 1 hour. And 4.77 kg, which was 94% based on the introduced molar amount, of terephthaloyl chloride (TPC) as a second dicarbonyl compound was added, followed by stirring for 1 hour, thereby preparing a first polymer solution.

The viscosity of the first polymer solution thus prepared was measured. If the measured viscosity did not reach the target viscosity, a TPC solution in a DMAc organic solvent at a concentration of 10% by weight was prepared, and 1 ml of the TPC solution was added to the first polymer solution, followed by stirring the mixture for 30 minutes. This procedure was repeated until the viscosity became 200,000 cps, thereby preparing a 15 second polymer solution.

The second polymer solution was transferred to a tank and stored at −10° C. It was degassed for 1.5 hours so that the pressure in the tank reached 0.3 bar. The tank was purged with nitrogen gas at an internal pressure of 1.5 atm. Upon the purging, the second polymer solution was stored in the tank for 30 hours.

Subsequently, the second polymer solution was cast onto a stainless-steel belt and then dried with hot air at 80° C. for 30 minutes, thereby producing a gel-sheet. Then, while the gel-sheet was moved, it was heated in a temperature range of 80° C. to 350° C. at a temperature elevation rate of 2° C./min to 80° C./min, followed by thermal treatment at the highest temperature for about 25 minutes. Thereafter, a first temperature lowering step was carried out by reducing the temperature at a rate of about 800° C./min, followed by a second temperature lowering step by reducing the temperature at a rate of about 100° C./min, thereby obtaining a base film, which was wound using a winder. In such event, the moving speed of the gel-sheet on the belt at the time of drying was 1 m/s. The speed of the winder was controlled such that the ratio of the moving speed of the gel-sheet on the belt at the time of drying to the moving speed of the film at the time of winding was within the range of 1:1.01 to 1:1.10.

A hard-coating layer was formed on one side of the polyimide-based film thus prepared. In order to form the hard-coating layer, 12 parts by weight of a multifunctional acrylate (M600, Miwon Specialty Chemical), 20 parts by weight of a urethane acrylate (PU2050, Miwon Specialty Chemical), 8 parts by weight of a nano-silica sol (average particle diameter: 12 nm), 60 parts by weight of methyl isobutyl ketone, 0.8 parts by weight of a photoinitiator (Irgacure 184, BASF), and 0.2 parts by weight of a leveling agent (601ADH2, Neos) were compounded with a stirrer to prepare a composition for forming a hard coating. Thereafter, the mixed coating composition was coated by a slot die coating method to a thickness of about 5 μm on one side of the polyimide-based film. Thereafter, the coated composition was dried at about 90° C. for about 2 minutes and cured by UV at 600 mJ/cm$^2$. As a result, a polyimide-based composite film comprising a polyimide-based film and a hard-coating layer was prepared.

Examples 2 and 3 and Comparative Examples 1 and 2

Tests were performed in the same manner as in Example 1, except that the contents of the respective reactants, the content and particle diameter of the filler, and the maximum temperature and time of the thermal treatment were changed as shown in Table 1 below. In addition, tests were performed in the same manner as in Example 1 with respect to the formation of a hard-coating layer, except that the contents of the multifunctional acrylate, urethane acrylate, nano-silica sol, and leveling agent (KY1203 Shin-Etsu or DAC-HP Daikin) were changed as shown in Table 2 below.

TABLE 1

|  | TFDB (molar ratio) | 6FDA (molar ratio) | TPC (molar ratio) | BPDC (molar ratio) | Filler content (% by weight) | Filler particle diameter (μm) | Max. temp. of thermal treatment (° C.) | Time of thermal treatment (min.) |
| --- | --- | --- | --- | --- | --- | --- | --- | --- |
| Ex. 1 | 0.20 | 0.06 | 0.05 | 0.09 | 1.1 | 0.1 | 350 | 25 |
| Ex. 2 | 0.20 | 0.05 | 0.06 | 0.09 | 1.1 | 0.1 | 300 | 20 |
| Ex. 3 | 0.20 | 0.03 | 0.10 | 0.07 | 0.6 | 0.1 | 350 | 25 |
| C. Ex. 1 | 0.20 | 0.06 | 0.05 | 0.09 | 0.6 | 1.0 | 250 | 20 |
| C. Ex. 2 | 0.20 | 0.05 | 0.06 | 0.09 | — | — | 250 | 20 |

TABLE 2

| | Urethane acrylate | Multifunctional acrylate | Nano-silica | Leveling agent | | |
| | | | | | | |
| | PU2050 | M600 | sol | 601ADH2 | KY1203 | DAC-HP |
|---|---|---|---|---|---|---|
| Ex. 1 | 20 | 12 | 8 | 0.2 | — | — |
| Ex. 2 | 20 | 12 | 8 | — | 0.2 | — |
| Ex. 3 | 20 | 12 | 8 | — | — | 0.2 |
| C. Ex. 1 | 20 | 12 | 8 | — | — | — |
| C. Ex. 2 | 25 | 15 | — | — | — | — |

Evaluation Example

The films prepared in Examples 1 to 3 and Comparative Examples 1 and 2 were each measured and evaluated for the following properties.

Evaluation Example 1: Measurement of Contact Angle

It was measured according to the German industrial standard (DIN 55660) using a mobile surface analyzer from Kruss in Germany.

Specifically, once the polyimide-based film had been prepared, the contact angle of the side (i.e., the second side) to be in contact with the hard-coating layer was measured. Then, the hard-coating layer was formed, followed by measuring the contact angle of the side (i.e., the first side) of the hard-coating layer located opposite to the side in contact with the polyimide-based film.

Evaluation Example 2: Measurement of Surface Polarity Index

The surface polarity index was calculated according to the following Equation 3.

$$SP = \frac{|A1 - A2|}{A1 + A2} \quad \text{[Equation 3]}$$

Here, A1 is the contact angle of the first side, and A2 is the contact angle of the second side.

Evaluation Example 3: Measurement of Surface Roughness

The surface roughness was measured using a 3D optical profiler contour GT from Bruker. The Sz roughness of the surface was measured at arbitrary three locations on the films of Examples and Comparative Examples, and an average value thereof was obtained.

An image was taken by the 3D optical profiler in the region of 220 μm×220 μm at each location, and the Sz roughness was measured therefrom. When the roughness was measured, Sz is a value defined according to ISO 25178-2:2012. Sz is the maximum height and is the sum of maximum peak height (Sp) and maximum pit height (Sv).

Specifically, once the polyimide-based film had been prepared, the surface roughness of the side (i.e., the second side) to be in contact with the hard-coating layer was measured. Then, the hard-coating layer was formed, followed by measuring the surface roughness of the side (i.e., the first side) of the hard-coating layer located opposite to the side in contact with the polyimide-based film.

Evaluation Example 4: Measurement of Leveling Index

The leveling index was calculated according to the following Equation 1.

$$\text{Leveling index} = \frac{Sz2 - Sz1}{Sz2 + Sz1} \quad \text{[Equation 1]}$$

Here, Sz1 is the Sz roughness (μm) of the first side, and Sz2 is the Sz roughness (μm) of the second side.

The results of Evaluation Examples 1 to 4 are shown in Table 3 below.

TABLE 3

| | Contact angle of second side (A2) | Contact angle of first side (A1) | Surface polarity index (SP) | Roughness of second side | Roughness of first side | Leveling index |
|---|---|---|---|---|---|---|
| Ex. 1 | 83° | 117° | 0.170 | 1.7 | 0.37 | 0.643 |
| Ex. 2 | 80° | 105° | 0.135 | 1.6 | 0.38 | 0.616 |
| Ex. 3 | 79° | 100° | 0.117 | 1.4 | 0.35 | 0.600 |
| C. Ex. 1 | 85° | 90° | 0.029 | 3.7 | 0.51 | 0.758 |
| C. Ex. 2 | 80° | 84° | 0.024 | 0.6 | 0.49 | 0.101 |

As shown in Table 3 above, the composite films prepared in Examples 1 to 3 had an appropriate leveling index and surface polarity index as compared with the composite films prepared in Comparative Examples 1 and 2.

Evaluation Example 5: Measurement of Haze

The haze was measured using a haze meter NDH-5000W manufactured by Nippon Denshoku Kogyo.

Evaluation Example 6: Measurement of Modulus

A sample was cut out by at least 5 cm in the direction perpendicular to the main shrinkage direction of the film and by 10 cm in the main shrinkage direction. It was fixed by the clips disposed at intervals of 5 cm in a universal testing machine UTM 5566A of Instron. A stress-strain curve was obtained until the sample was fractured while it was stretched at a rate of 5 mm/min at room temperature. The slope of the load with respect to the initial strain on the stress-strain curve was taken as the modulus (GPa).

Evaluation Example 7: Measurement of Yellow Index (YI)

The yellow Index (YI) was measured with a spectrophotometer (UltraScan PRO, Hunter Associates Laboratory) using a CIE colorimetric system.

Evaluation Example 8: Measurement of Transmittance

The transmittance at 550 nm was measured using a haze meter NDH-5000W manufactured by Nippon Denshoku Kogyo.

Evaluation Example 9: Measurement of Elongation of the Hard-Coating Layer

The elongation of the hard-coating layer was measured by stretching the hard-coated transparent polyimide-based composite film cut to a size of 100 mm×10 mm in the longitudinal direction using a universal testing machine from Korea Qmesys in Korea.

Evaluation Example 10: Measurement of Thickness of the Hard-Coating Layer

The thickness of the hard-coating layer of the composite film was measured using an optical thickness measuring device F20 from Filmetrics.

Evaluation Example 11: Calculation of FT

The FT was calculated according to the following Equation 2.

$$FT = \frac{Sz2}{Th} \qquad [\text{Equation 2}]$$

Here, Th is the thickness (μm) of the functional layer, and Sz2 is the Sz roughness (μm) of the second side.

Evaluation Example 12: Optical Defect Test

The composite film was attached to an inspection table in a darkroom with care not to cause adhesion of foreign matters and scratches during handling. The light of the darkroom was turned off, and the film surface was observed using a halogen lamp. As a result, if optical defects were observed with the naked eyes, it was evaluated as x. If optical defects were not observed with the naked eyes, it was evaluated as ○.

The results of Evaluation Examples 5 to 12 are shown in Tables 4 below.

TABLE 4

|  | Haze | Modulus | YI | Transmittance | Elongation of hard-coating layer | Thickness of hard-coating layer | FT (Eq. 2) | Optical defect |
|---|---|---|---|---|---|---|---|---|
| Ex. 1 | 0.41 | 5.72 | 2.1 | 91 | 3.2% | 5 μm | 0.34 | ○ |
| Ex. 2 | 0.42 | 5.74 | 2.2 | 92 | 3.2% | 5 μm | 0.32 | ○ |
| Ex. 3 | 0.43 | 5.73 | 2.3 | 91 | 3.2% | 5 μm | 0.28 | ○ |
| C. Ex. 1 | 0.45 | 5.71 | 2.1 | 90 | 2.8% | 5 μm | 0.74 | x |
| C. Ex. 2 | 0.38 | 5.3 | 2.3 | 91 | 3.5% | 5 μm | 0.12 | x |

As shown in Table 4 above, the films prepared in Examples 1 to 3 had high elongation of the hard-coating layer and appropriate FT without optical defects as compared with the films prepared in Comparative Examples 1 and 2.

Evaluation Example 13: Measurement of Film Thickness

The thickness was measured at 5 points in the transverse direction using a digital micrometer 547-401 manufactured by Mitutoyo Corporation. Their average value was adopted as the thickness.

Evaluation Example 14: Adhesiveness Test

Two polyimide-based composite films cut to a size of 10 cm×10 cm were prepared. The two polyimide-based composite films were superposed with the first and second sides in contact with each other, which was then compressed at a temperature of 40° C. for 24 hours under a load of 20 kg. Thereafter, the compressed polyimide-based composite film was cooled to room temperature. If the lower film was detached by its own weight, it was marked as ○. If it was not detached, it was marked as x.

Evaluation Example 15: Scratch Test

The polyimide-based composite film in a roll shape was taken three times at 1 m each and observed with the naked eyes. If longitudinal or transverse scratches observed were less than 10, it was marked as ○. If they were 10 or more, it was marked as x.

The results of Evaluation Examples 13 to 15 are shown in Table 5 below.

TABLE 5

| | Film thickness (μm) of base layer/hard-coating layer | Adhesiveness test | Scratch test |
|---|---|---|---|
| Ex. 1 | 50/5 | ○ | ○ |
| Ex. 2 | 50/5 | ○ | ○ |
| Ex. 3 | 50/5 | ○ | ○ |
| C. Ex. 1 | 50/5 | ○ | ○ |
| C. Ex. 2 | 50/5 | x | x |

As shown in Table 5 above, the films prepared in Examples 1 to 3 had high adhesiveness and excellent results of the scratch test as compared with the films prepared in Comparative Examples 1 and 2.

REFERENCE NUMERALS OF THE DRAWINGS

10: polymerization apparatus
20: tank
30: casting body
40: thermal curing device
50: winder
100: cover window
101: first side
102: second side
110: base film
111: second protrusion
120: functional layer
121: first protrusion
200: adhesive layer
300: display panel
400: display device

The invention claimed is:

1. A polyimide-based composite film, which comprises a base film comprising a polyimide-based resin; and a functional layer disposed on the base film,
wherein when the side of the functional layer located opposite to the side in contact with the base film is referred to as a first side and when the side of the base film in contact with the functional layer is referred to as a second side, the leveling index represented by the following Equation 1 is 0.11 to 0.7:

$$\text{Leveling index} = \frac{Sz2 - Sz1}{Sz2 + Sz1} \quad \text{[Equation 1]}$$

wherein Sz1 is the Sz roughness (μm) of the first side, and Sz2 is the Sz roughness (μm) of the second side,
wherein the functional layer comprises an organic resin, and the organic resin is at least one selected from the group consisting of an acrylate-based monomer, a urethane acrylate-based oligomer, and an epoxy acrylate-based oligomer,
wherein the base film further comprises a filler, and the filler has a particle diameter of 0.05 μm to 0.9 μm, and wherein the functional layer further comprises an inorganic filler, and the inorganic filler has a particle diameter of 1 nm to 100 nm.

2. The polyimide-based composite film of claim 1, wherein the Sz2 is 0.01 μm to 5 μm, and Sz1 is 0.01 μm to 4 μm.

3. The polyimide-based composite film of claim 1, wherein the Sz2 is 0.05 μm to 4 μm, and Sz1 is 0.05 μm to 3 μm.

4. The polyimide-based composite film of claim 1, wherein the Sz2 is 0.1 μm to 4 μm, and Sz1 is 0.1 μm to 3 μm.

5. The polyimide-based composite film of claim 1, wherein the leveling index is 0.11 to less than 0.65.

6. The polyimide-based composite film of claim 1, wherein the filler is at least one selected from the group consisting of barium sulfate, silica, and calcium carbonate.

7. The polyimide-based composite film of claim 1, wherein the functional layer has a thickness of 2 μm to 10 μm, and the FT represented by the following Equation 2 is less than 0.7:

$$FT = \frac{Sz2}{Th} \quad \text{[Equation 2]}$$

wherein Th is the thickness (μm) of the functional layer.

8. The polyimide-based composite film of claim 7, wherein the FT is 0.14 to 0.6.

9. The polyimide-based composite film of claim 1, wherein the surface polarity index (SP) represented by the following Equation 3 is 1/40 or more:

$$SP = \frac{|A1 - A2|}{A1 + A2} \quad \text{[Equation 3]}$$

wherein A1 is the contact angle of the first side, and A2 is the contact angle of the second side.

10. The polyimide-based composite film of claim 1, wherein the functional layer has an elongation of 2% or more.

11. The polyimide-based composite film of claim 1, which a haze of 3% or less, a yellow index of 5 or less, a modulus of 5 GPa or more, and a transmittance of 80% or more.

12. A display device, which comprises a display panel; and a cover window disposed on the display panel,
wherein the cover window comprises a base film; and a functional layer disposed on the base film, and when the side of the functional layer located opposite to the side in contact with the base film is referred to as a first side and when the side of the base film in contact with the functional layer is referred to as a second side, the leveling index represented by the above Equation 1 is 0.11 to 0.7:

$$\text{Leveling index} = \frac{Sz2 - Sz1}{Sz2 + Sz1} \quad \text{[Equation 1]}$$

wherein Sz1 is the Sz roughness (μm) of the first side, and Sz2 is the Sz roughness (μm) of the second side,
wherein the base film further comprises a filler, and the filler has a particle diameter of 0.05 μm to 0.9 μm, and wherein the functional layer further comprises an inorganic filler, and the inorganic filler has a particle diameter of 1 nm to 100 nm.

\* \* \* \* \*